United States Patent
Hidaka et al.

(10) Patent No.: US 6,316,726 B1
(45) Date of Patent: Nov. 13, 2001

(54) SURFACE MOUNT ELECTRONIC COMPONENT HAVING ELECTRODES SUPPRESSING THE OCCURRENCE OF MIGRATION

(75) Inventors: Akio Hidaka, Miyazaki; Akito Hamazono, Kumamoto; Katsumi Sasaki; Shoichi Ikebe, both of Miyazaki, all of (JP)

(73) Assignee: Matsushita Electric Industrial Co., Ltd., Osaka (JP)

( * ) Notice: Subject to any disclaimer, the term of this patent is extended or adjusted under 35 U.S.C. 154(b) by 0 days.

(21) Appl. No.: 09/444,735

(22) Filed: Nov. 22, 1999

(30) Foreign Application Priority Data

Nov. 20, 1998 (JP) .................................................. 10-330678

(51) Int. Cl.[7] .................................................... H01L 23/28
(52) U.S. Cl. .......................... 174/52.2; 257/693; 257/696
(58) Field of Search ................................ 174/52.2, 52.4; 257/787, 693, 696; 361/773, 760

(56) References Cited

U.S. PATENT DOCUMENTS

| | | |
|---|---|---|
| 4,497,012 | 1/1985 | Gottlieb et al. . |
| 4,510,554 | 4/1985 | Irikura . |
| 4,933,811 | 6/1990 | Dorlanne . |
| 4,959,505 | 9/1990 | Ott . |
| 5,420,745 | 5/1995 | Hidaka et al. . |
| 6,046,507 | * 4/2000 | Hatchard et al. ................... 257/790 |

FOREIGN PATENT DOCUMENTS 62-192630   5/1986   (JP) .

* cited by examiner

*Primary Examiner*—Shawn Riley
(74) *Attorney, Agent, or Firm*—Ratner & Prestia

(57) ABSTRACT

A surface mount component includes a substrate having two main faces, and first electrodes made of a metal, such as zinc, which is unlikely to cause migration. The first electrodes are formed on most of the entire face of both main faces of the substrate. Second electrodes made of a superior bonding material, such as copper, are disposed on the first electrodes. Lead terminals are bonded to the second electrodes by a bonding material, and an external packaging material covers the surface mount component. This configuration suppresses the occurrence of migration and improves resistance to electrical breakdown.

15 Claims, 5 Drawing Sheets

SURFACE MOUNT ELECTRONIC COMPONENT HAVING ELECTRODES SUPPRESSING THE OCCURRENCE OF MIGRATION

FIELD OF THE INVENTION

The present invention relates to the field of surface mount electronic components employed in general electronic equipment and power supply devices.

BACKGROUND OF THE INVENTION

FIG. 8 is a sectional view of a conventional surface mount capacitor.

As described in FIG. 8, an electrode material 2 is formed on both main faces of a dielectric substrate 1. A lead terminal 3 connected to each electrode material 2 extends to an external terminal 3a. The entire assembly is then covered with an external packaging material 4, except for the external terminal 3a which protrudes from the external packaging material 4 and is formed on the external packaging material 4.

As most electronic equipment becomes smaller, surface mount electronic components used in such equipment also need to further reduce the size in proportion. However, examination of the feasibility of creating smaller surface mount capacitors with the configuration shown in FIG. 8 reveals that problems may occur due to migration and reduced resistance to electrical breakdown.

SUMMARY OF THE INVENTION

A surface mount electronic component of the present invention includes the following: a substrate; more than one electrode, made of a material unlikely to cause migration, which substantially covers entire surfaces of both of the main faces of the substrate; more than one lead terminal bonded respectively to the electrodes using a bonding material; and an external packaging material entirely covering the faces of the substrate and electrodes, and at least part of the lead terminals.

The above configuration prevents the occurrence of migration even if the substrate becomes thinner as a result of the miniaturization and slimming of surface mount electronic components. Thus, characteristics such as capacitance are unlikely to change during use. The formation of the electrodes over most of the main faces of the substrate prevents concentration of electric line of force on the substrate ends, enabling the electric line of force to be uniformly distributed. Thus, resistance to electrical breakdown may be improved.

Furthermore, in the surface mount electronic component of the present invention, a first electrode made of a material unlikely to cause migration is formed on the substrate and a second electrode made of a material likely to adhere the bonding material is formed on the first electrode.

This configuration enables the bonding strength between the second electrode and lead terminal to be increased even in the case of poor adhesivity between the material for the first electrode and the bonding material. This prevents degradation of characteristics, for example, due to peeling of the lead terminal from the electrode during the manufacturing processes.

DESCRIPTION OF THE PREFERRED EMBODIMENT

Figure 1:
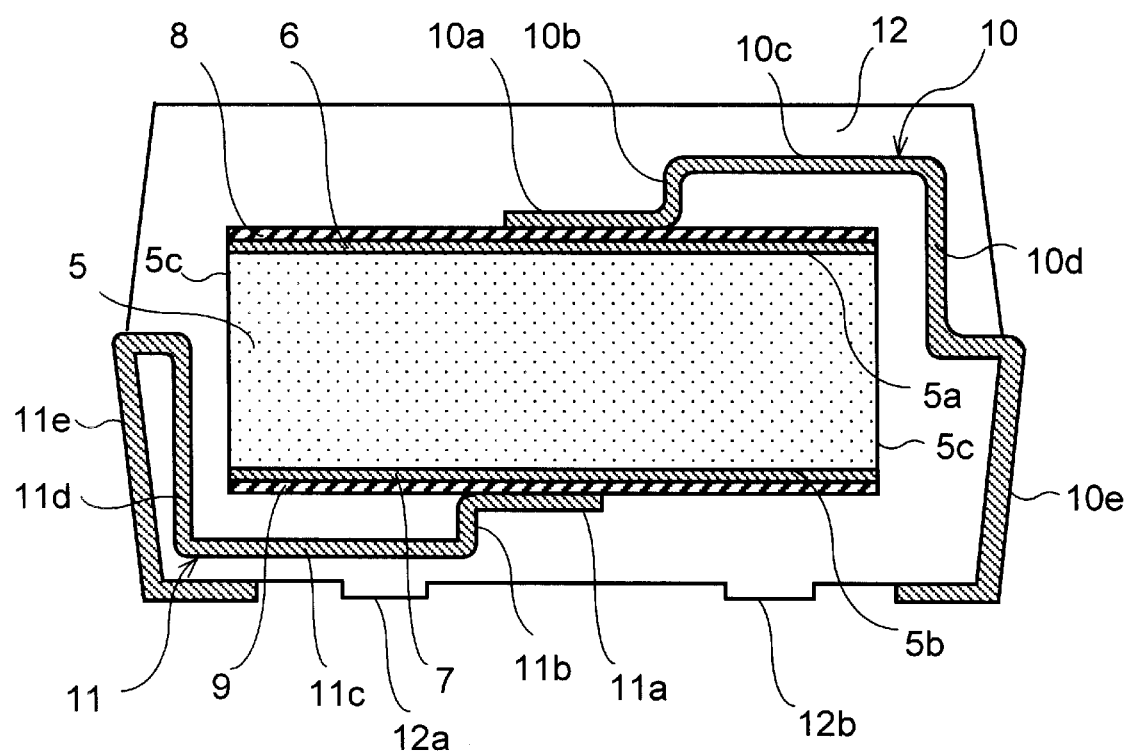
FIG. 1 is a sectional view of a surface mount electronic component in accordance with a preferred embodiment of the present invention.

FIG. 1 is a sectional view of a surface mount capacitor in a preferred embodiment of the present invention.

As shown in FIG. 1, in the surface mount capacitor in the preferred embodiment, first electrodes 6 and 7 made of zinc or other zinc-containing materials are formed on both main faces of a substrate 5. Second electrodes 8 and 9 made of copper or other copper-containing materials are formed on the first electrodes 6 and 7. Lead terminals 10 and 11 are respectively connected to the second electrodes 8 and 9. These elements are covered with an external packaging material 12 except for a portion of the lead terminals 10 and 11.

Each element of the surface mount capacitor in the preferred embodiment is described below in detail.

The substrate 5 is typically made of a dielectric material. In other words, the main constituent of the substrate 5 is, preferably, at least one of barium titanate and strontium titanate to which other chemicals such as calcium carbonate or silicon oxide are added. These materials have an extremely large dielectric constant, realizing large capacitance with little loss. They also have good workability.

The substrate 5 is processed into a disc, with a diameter of between 2 mm and 8 mm, and preferably between 4 mm and 7 mm. Its thickness is between 0.3 mm and 1.2 mm, and preferably between 0.5 mm and 1 mm. A diameter of 2 mm or less may not allow sufficient capacitance to be achieved. A diameter of 8 mm or above hinders miniaturization. A thickness of 0.3 mm or less prevents workability and is likely to lead to cracks, reducing productivity. A thickness of 1.2 mm or above hinders miniaturization. The substrate 5 in the preferred embodiment has a disc shape. However, an oval substrate is also acceptable. The oval substrate may have larger main faces, leading to increased capacitance. The substrate 5 may also have a shape with corners such as a square substrate.

Furthermore, by making the center of the substrate 5 thicker than its edges, the mechanical strength of the substrate 5 may be improved. Contrarily, by making the edges of the substrate 5 thicker than its center, capacitance may be increased. Such configurations are selected depending on the required capacitance during use and other conditions.

The following method is preferably used for manufacturing the substrate 5.

First, a predetermined amount of each material for the dielectric mixture is weighed, and mixed using the ceramic method. It is then dried and granulated using a binder such as polyvinyl alcohol. The granulated material is molded into, for example, 6 mm diameter and 1 mm thick disc under a pressure of about 1000 kg/cm$^2$. The molded material is fired at, for example, between 1300° C. and 1400° C. in air to finally create the substrate 5 with a diameter of 5 mm and 0.8 mm thick.

Other than dielectric material, the substrate 5 may also be made of materials showing conductivity by applying a voltage higher than a predetermined voltage. In this case, a surface mount non-linear resistance element is achieved. The substrate 5 may also be a so-called laminated substrate in which there are one or more isolated conductive layers.

Next, the first electrodes 6 and 7 are described in detail.

The first electrodes 6 and 7 are provided respectively on main faces 5a and 5b, and are made of zinc or zinc and predetermined additives. The first electrodes 6 and 7 are provided over most of the main faces 5a and 5b of the substrate 5. Here, the area of the first electrode 6 is 95% or above, preferably 98% or above, of the main face 5a. The same relation applies to the area of the first electrode 7 and the main face 5b of the substrate 5. By configuring the main faces 5a and 5b of the substrate 5 and the first electrodes 6 and 7 as described above, the electric line of force may be distributed uniformly, thus improving resistance to electrical breakdown.

A preferable film thickness of the first electrodes 6 and 7 is between 1 $\mu$m and 10 $\mu$m. If a thickness of the first electrodes 6 and 7 is 1 $\mu$m or less, adhesivity to the substrate 5 degrades. If a thickness of the first electrodes 6 and 7 is 10 $\mu$m or above, stress of the first electrodes 6 and 7 itself increases, also reducing its adhesivity to the substrate 5.

The first electrodes 6 and 7 are formed by applying zinc or zinc alloy paste respectively to the main faces 5a and 5b of the substrate 5 using a method such as printing, and typically firing at between 550° C. and 650° C. for about 7 to 13 minutes in air. By firing the first electrodes 6 and 7, etching the surface of the substrate 5, which would otherwise be required in the conventional process, is eliminated, thus preventing degradation of its characteristics even if the substrate 5 is made thinner.

Oxides are formed on the surface of the first electrodes 6 and 7 during firing. It is therefore preferable to implement etching after forming the first electrodes 6 and 7, in order to remove these oxides. By etching the first electrodes 6 and 7 and roughening their surfaces to between 2 $\mu$m and 8 $\mu$m, adhesivity of the second electrodes 8 and 9 to the first electrodes 6 and 7 may be improved, wherein the second electrodes 8 and 9 are formed on the first electrodes 6 and 7. The film characteristics of the second electrodes 8 and 9 may also be improved.

The first electrodes 6 and 7 may also be made of at least one of the following: nickel, zinc, palladium, gold, aluminum, and copper nickel alloy in the first group, or at least one in the first group and at least one other material not in the first group. These materials prevent migration. In other words, these materials are unlikely to move into the substrate 5 as a result of applying voltage. In particular, zinc or zinc alloy is obtainable at low cost and is effective for suppressing migration.

Next, the second electrodes 8 and 9 are described in detail.

The second electrodes 8 and 9 are made of copper, nickel, or either metal with predetermined element(s) added. If particular consideration is being paid to cost, copper or copper alloy is preferable. The second electrodes 8 and 9 are formed on the first electrodes 6 and 7, preferably using the plating method. Here, same as the first electrodes 6 and 7, an area of the second electrodes 8 and 9 is 95% or above, preferably 98% or above of the main faces 5a and 5b. A preferable thickness of the second electrodes 8 and 9 is 1 $\mu$m or above. If a film thickness is thinner than 1 $\mu$m, moisture content entering into the substrate from the outside increases, degrading insulation resistance. With consideration to cost and production period, a preferable thickness of the second electrodes 8 and 9 is 20 $\mu$m or less.

The second electrodes 8 and 9 are preferably made of at least one of the following: gold, silver, copper, platinum, and nickel in the second group, or at least one in the second group and at least one other material not in the second group. In other words, it is preferable to make the second electrodes 8 and 9 using materials having good bondability to solder or lead-free solder (a bonding material of Sn containing at least one of Ag, Cu, Zn, Bi, and In). This enables to improve bonding strength to the lead terminal by forming the second electrodes 8 and 9 on the first electrodes 6 and 7 even in the case of poor adhesivity between the first electrodes 6 and 7 and bonding material. Thus, degradation of the characteristics, for example, due to peeling of the lead terminal from the electrodes during manufacturing processes is preventable.

The second electrodes 8 and 9 are formed by immersing the substrate 5, after forming the first electrodes 6 and 7, in a plating solution such as copper plating solution.

In the preferred embodiment, the first electrodes 6 and 7 are formed only on the main faces of the substrate 5, and then the second electrodes 8 and 9 are formed onto the first electrodes 6 and 7, typically by plating. Other methods include the formation of a zinc conductive film on all faces of the substrate 5, typically by firing, and overlay of a conductive film, such as copper, onto the conductive film, typically by plating. The conductive film on side faces 5c of the substrate 5 is then removed by grinding, typically using a centerless grinder. In this case, the first electrodes 6 and 7 and the second electrodes 8 and 9 are formed by removing the conductive film formed on the side faces 5c. Here, if the side faces 5c are roughened to a greater degree than the main faces 5a and 5b by adjusting the grinding conditions, the adhesivity with the external packaging material 12 may be improved, reducing undesirable peeling of the electrode from the substrate and improving mechanical strength.

Next, the lead terminals 10 and 11 are described in detail.

The lead terminals 10 and 11 are thin plates, typically made of Fe—Ni alloy or Fe—Cu alloy. To improve bondability to the lead terminals 10 and 11, a bonding layer made, for example, of solder may be formed on their surfaces. The lead terminals 10 and 11 with a thickness between 0.07 mm and 0.12 mm and width between 2.0 mm and 3.0 mm have advantages in handling, strength, and workability.

The lead terminals 10 and 11 include the following portions: bonding areas 10a and 11a which are bonded respectively to the second electrodes 8 and 9; stepped areas 10b and 11b which are areas next to bonding areas 10a and 11a, rising from the second electrodes 8 and 9; horizontal areas 10c and 11c stretching from the stepped areas 10b and 11b approximately parallel to the second electrodes 8 and 9; vertical areas 10d and 11d stretching from the horizontal areas 10c and 11c approximately perpendicular to the surface of the second electrodes 8 and 9; and external terminal areas 10e and 11e stretching from the vertical areas 10d and 11d.

Figure 2:
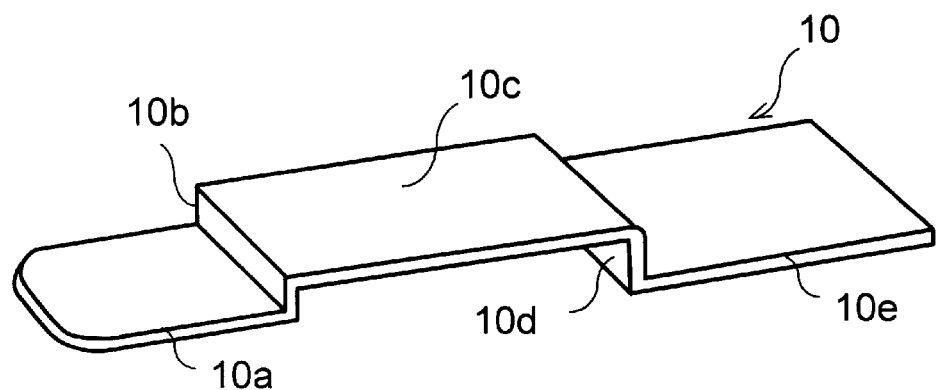
FIG. 2 is a perspective view of a lead terminal of the surface mount electronic component in accordance with the preferred embodiment of the present invention.

FIG. 2 shows the configuration of the lead terminal 10. The configuration of the lead terminal 11 is mostly the same as that of the lead terminal 10, and is thus not illustrated. By providing the lead terminal with the shape shown in FIG. 2, the distance between the first electrodes 6 and 7 and second electrodes 8 and 9 and lead terminals 10 and 11 may be increased, thus improving the breakdown voltage. Moreover, a space may be created between the lead terminals 10 and 11 and the substrate 5 for filling with the external packaging material 12, thus improving weather resistance. Furthermore, several bends in the lead terminals 10 and 11 prevent moisture from penetrating along the lead terminals 10 and 11 and reaching the first electrodes 6 and 7 and second electrodes 8 and 9, thus improving moisture resistance.

Figure 3:
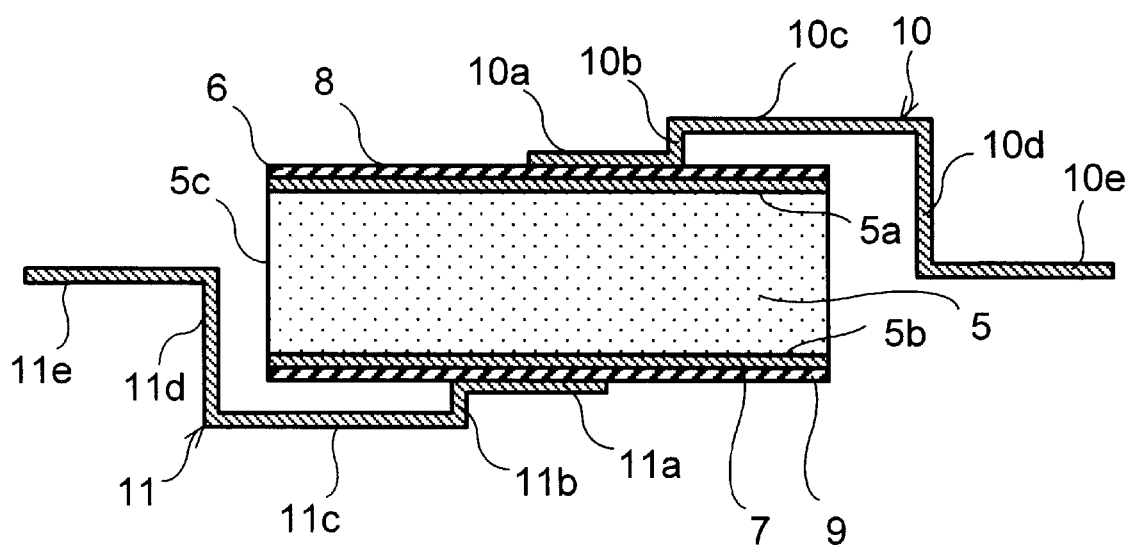
FIG. 3 is a sectional side view of semi-finished surface mount electronic component in accordance with the preferred embodiment of the present invention.

The lead terminals 10 and 11 are bonded onto the second electrodes 8 and 9 formed respectively on the main faces 5a and 5b of the substrate 5, using solder or conductive adhesive. (FIG. 3)

As for the bonding material for bonding the lead terminals 10 and 11 onto the second electrodes 8 and 9, a conductive bonding material with melting point above 190° C., and preferably 250° C. or above, such as solder, lead-free solder, or solder paste is used. By using a bonding material with high melting temperature, stable connection of the lead terminals 10 and 11 to a circuit board may be assured without release of the lead terminals 10 and 11 from the electrode or creation of space due to melting of the bonding material, even when the surface mount electronic component is heated to around 180° C. in a reflow furnace or other high-temperature equipment.

Next, the external packaging material 12 is described in detail.

The external packaging material 12 is preferably made of epoxy resin which has good moisture resistance.

The external packaging material 12 is formed into an approximately rectangular parellelepiped shape as shown in FIG. 1. The substrate 5 after attaching the lead terminals 10 and 11, as described above, is fixed between transfer molds preheated to between 150° C. and 190° C. Tablet epoxy resin with outer dimensions of 30 mm and thickness of 15 mm is injected into the molds under a pressure of 100 kg/cm$^2$ using a plunger over a period of about 120 seconds.

After forming the external packaging material 12, the external terminal areas 10e and 11e protruding from the external packaging material 12 are bent along the side faces and bottom face of the external packaging material 12 to complete the surface mount electronic component as shown in FIG. 1.

As shown in FIG. 1, flat protrusions 12a and 12b are provided on the external packaging material 12 in the area facing the circuit board, etc. (hereafter referred to as the "bottom face"). The protrusions 12a and 12b may preferably not contact each other, and are formed so as to stretch in the vertical direction as illustrated in FIG. 1. By providing the protrusions 12a and 12b, a surface mount electronic component may be stably anchored; also, the surface distance of the external packaging material 12 between the external terminal areas 10e and 11e may be made longer, thus improving insulation.

The difference in effect of the surface mount electronic component of the present invention as configured above and a conventional surface mount electronic component is described next.

Figure 8:
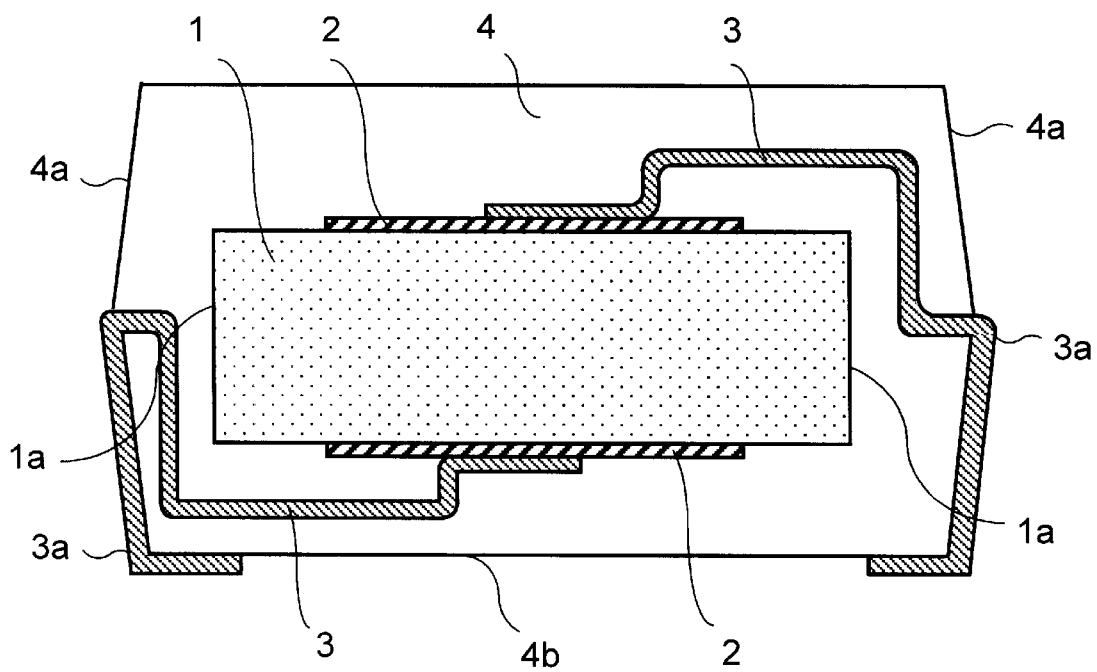
FIG. 8 is a sectional view of a conventional surface mount electronic component.

First, 10 samples of the surface mount electronic component in the preferred embodiment as shown in FIGS. 1, 2, and 3, and 10 samples of the prior art were created. The conventional samples have a silver electrode formed on only a part of the main face of the substrate, as shown in FIG. 8. Otherwise, their structure is the same as that of the present invention. The substrate used for the samples of the preferred embodiment is a disc substrate 0.8 mm thick and 5 mm in diameter. Zinc paste is fired on the substrate to form the first electrode, and copper is plated as the second electrode.

AC voltage was gradually increased from 0 V in the sample capacitors, and AC voltage at breakdown was measured. Table 1 shows the results.

TABLE 1

| | AC voltage at breakdown (kV$_{AC}$) | | | | | | | | | |
|---|---|---|---|---|---|---|---|---|---|---|
| conventional capacitor | 3.2 | 3.6 | 3.3 | 3.5 | 3.6 | 3.4 | 3.4 | 3.4 | 3.5 | 3.7 |
| capacitors of the present invention | 5.0 | 6.0 | 5.5 | 5.4 | 6.1 | 7.0 | 5.2 | 5.5 | 5.7 | 5.2 |

It is apparent from Table 1 that conventional capacitors sustain damage at an AC voltage of 3.2 kV–3.7 kV. On the other hand, the capacitors of the present invention remain intact up to 5.0 kV–7.0 kV. Accordingly, the preferred embodiment demonstrates a greatly improved breakdown voltage.

A life test (temperature: 60° C., humidity: 95% RH, and AC voltage: 250 V) was then conducted on different electrode materials to investigate any changes in insulation resistance over a predetermined time under the above conditions. Table 2 shows the results.

TABLE 2

| electrode materials | 500 hr | 1000 hr | 1500 hr | 2000 hr |
|---|---|---|---|---|
| silver paste | $1 \times 10^{10}$ | damaged | | |
| copper paste | $5 \times 10^{9}$ | $2 \times 10^{9}$ | $2 \times 10^{9}$ | $1 \times 10^{8}$ |
| copper plating | $3 \times 10^{10}$ | $7 \times 10^{9}$ | $2 \times 10^{9}$ | $1 \times 10^{9}$ |
| nickel plating | $2 \times 10^{10}$ | $8 \times 10^{9}$ | $3 \times 10^{9}$ | $3 \times 10^{9}$ |
| zinc paste + copper plating | $5 \times 10^{11}$ | $2 \times 10^{11}$ | $2 \times 10^{11}$ | $1 \times 10^{11}$ |

Notes: Unit is Ω, Minimum insulation resistance out of ten samples is entered.

It is apparent from Table 2 that migration occurs if the electrode is made of silver paste, with capacitors suffering damage after 1,000 hours. In the case of electrodes made of copper and nickel plating, insulation resistance drops by about 1 digit after 2,000 hours due to etching of the substrate by the plating solution.

In the case of electrodes formed by firing copper paste, insulation resistance also dropped by about 1 digit after 2,000 hours due to the detrimental effects on the substrate of firing of copper paste in a reductive ambient. As described above, conventional samples comprising a single metal layer for the electrode show less satisfactory insulation resistance.

The preferred embodiment, which employs electrodes formed by plating copper over fired zinc paste on the electrode, prevented migration and was almost completely unaffected by etching. Even after 2,000 hours, insulation resistance did not change by one digit.

Next, a life test (temperature: 60° C., humidity: 95% RH, and AC voltage: 250V) was conducted on the preferred embodiment using different thicknesses of the copper electrode layer (the second electrodes 8 and 9) with the first electrodes 6 and 7 at a fixed thickness in the preferred embodiment. Under the above conditions, changes in insulation resistance over a predetermined time were examined. Table 3 shows the results.

TABLE 3

| Thicknesses of the copper electrode layer | 500 hr | 1000 hr | 1500 hr | 2000 hr |
|---|---|---|---|---|
| 0.5 $\mu$m | $2 \times 10^{10}$ | $5 \times 10^9$ | $3 \times 10^9$ | $2 \times 10^9$ |
| 1.0 $\mu$m | $5 \times 10^{10}$ | $1 \times 10^{10}$ | $3 \times 10^9$ | $3 \times 10^9$ |
| 2.0 $\mu$m | $5 \times 10^{11}$ | $2 \times 10^{11}$ | $2 \times 10^{11}$ | $2 \times 10^{11}$ |
| 3.0 $\mu$m | $5 \times 10^{11}$ | $2 \times 10^{11}$ | $2 \times 10^{11}$ | $1 \times 10^{11}$ |

Notes: Unit is $\Omega$, Minimum insulation resistance out of ten samples is entered.

It is apparent from Table 3 that insulation resistance changes by one digit after 2000 hours if a thickness of the second electrodes 8 and 9 is 1.0 $\mu$m or below. In the case of a thickness 1.0 $\mu$m or above, insulation resistance did not change by one digit after 2,000 hours. Thin second electrodes 8 and 9 allow moisture to penetrate into the first electrodes 6 and 7 and even to the substrate 5, degrading insulation resistance. Accordingly, the second electrodes 8 and 9 are preferably made 1 $\mu$m or thicker in order to improve moisture resistance. Thicker film demonstrated higher moisture resistance, however, its effect is saturated in 20 $\mu$m or thicker. With consideration to cost, it is thus preferable to create second electrodes 8 within 20 $\mu$m thick.

Next, a life test (temperature; 60° C., humidity: 95% RH, and AC voltage: 250 V) was conducted on the preferred embodiment using different thicknesses of the first electrodes 6 and 7 with the second electrodes 8 and 9 at a fixed thickness. Under the above conditions, changes in capacitance over a predetermined time were examined. Table 4 shows the results.

TABLE 4

| Thicknesses of the zinc electrode layer | 500 hr | 1000 hr | 1500 hr | 2000 hr |
|---|---|---|---|---|
| 3.0 $\mu$m | -2% | -7% | -9% | -10% |
| 5.0 $\mu$m | -3% | -7% | -8% | -12% |
| 10.0 $\mu$m | -3% | -7% | -10% | -14% |
| 15.0 $\mu$m | -9% | -14% | -20% | -28% |

Notes: Average capacitance change of ten samples is entered.

It is apparent from Table 4 that the first electrodes 6 and 7 when 3 $\mu$m to 10 $\mu$m thick showed an approximately 10% change in capacitance after 2,000 hours. The change reaches about 20% if the first electrodes 6 and 7 are 15 $\mu$m thick. The stress generated by the first electrodes 6 and 7 degrades the bonding strength with the substrate 5, and causes the first electrodes 6 and 7 to detach from the substrate 5.

Next, the shapes of the edges of the first electrode 6 and second electrode 8 are described. The first electrode 7 and second electrode 9 have about the same shapes as those of the first electrode 6 and second electrode 8, and thus their description is omitted here.

Figure 4:
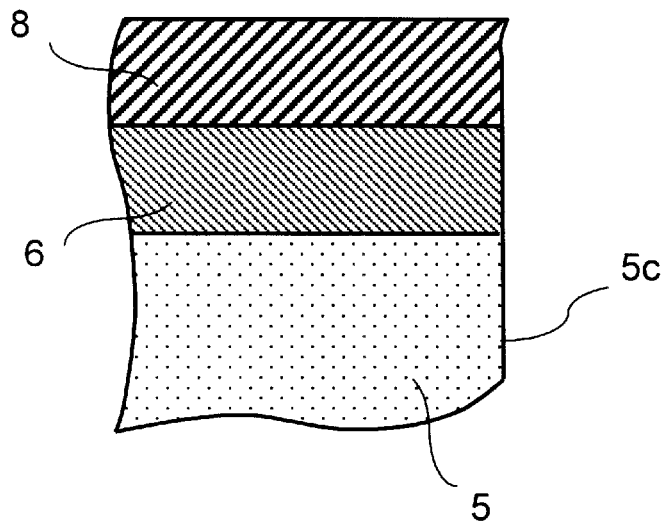
FIG. 4 is a fragmentary sectional view on larger scale of a substrate of the surface mount electronic component in accordance with the preferred embodiment of the present invention.

As shown in FIG. 4, if the edges of the first electrode 6 and second electrode 8 protrude from a face leveled to the side face 5c or side face 5c itself, electric discharge may occur at the first electrode 6 and at the second electrode 8.

In case of the prior art, electric discharge is unlikely to occur because the electrode is formed only on a part of the main face of the substrate. However, it may occur in the configuration of the preferred embodiment.

Figure 5:
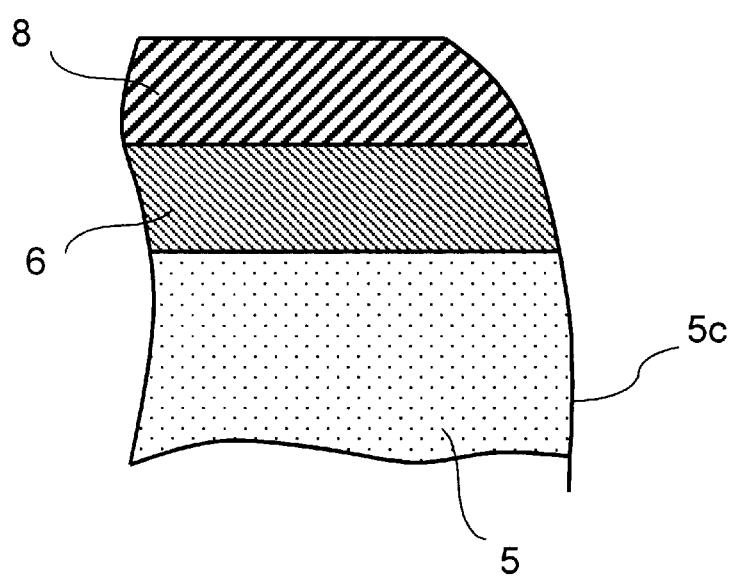
FIG. 5 is a fragmentary sectional view on larger scale of the substrate of the surface mount electronic component in accordance with the preferred embodiment of the present invention.

Accordingly, as shown in FIG. 5, the edges of the first electrode 6 and second electrode 8 may preferably be configured inside the level of side face 5c. Furthermore, the sectional shapes of the edges of the electrodes 6 and 8 are preferably curved. Sufficient effect may be achieved by providing a curved electrode edge to at least one part. If this shape is provided over the entire circumference, a capacitor with high breakdown voltage is achievable. In addition, the stress is unlikely to be concentrated on curved edges. Thus, peeling of the electrode due to the stress generated at the time of filling the external packaging material is preventable, reducing deviations in capacitance.

Figure 6:
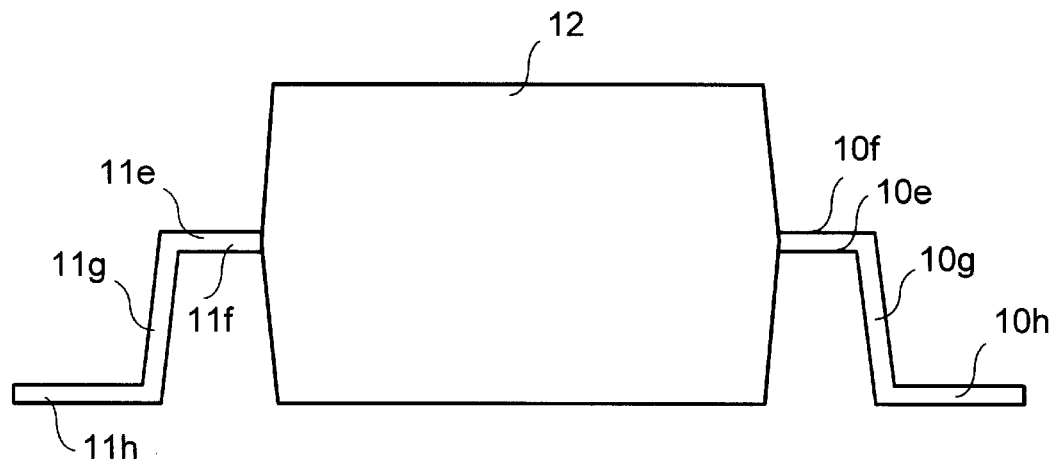
FIG. 6 is a side view of the surface mount electronic component in accordance with the preferred embodiment of the present invention.

Another effective method for improving breakdown voltage is to bend the external terminal areas 10e and 11e outward respectively, as shown in FIG. 6, and not along the bottom face of the external packaging material 12. More specifically, the external terminal areas 10e and 11e comprise lead-out areas 10f and 11f, extending areas 10g and 11g stretching towards the bottom of the external packaging material, and attachment areas 10h and 11h stretching against the external packaging material 12 and bonded to an electrode pattern such as a circuit board. With this configuration, the distance between exposed lead terminals 10 and 11 may be widened, thus improving breakdown voltage.

Figure 7:
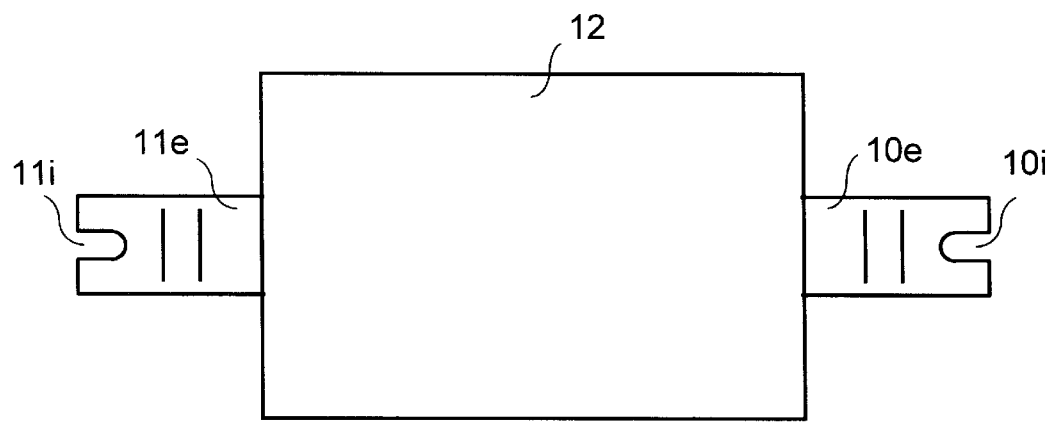
FIG. 7 is a top view of the surface mount electronic component in accordance with the preferred embodiment of the present invention.

To improve bonding strength to electrode patterns such as circuit boards, notches 10i and 11i may be provided on the attachment areas 10h and 11h as shown in FIG. 7. This expands the area contacting solder or other bonding material, improving bonding strength.

As described above, the surface mount electronic component of the present invention is designed to use areas protruding from the external packaging material as the external connecting terminals. The electrode is formed over approximately the entire main face of the substrate. At the same time, the electrode is made of materials unlikely to cause migration. This allows to distribute electric line of force uniformly without concentrating it at the edges of the substrate even if the capacitor is made smaller. Thus, the present invention enables improved resistance to electrical breakdown and also suppresses the occurrence of migration.

The preferred embodiment of the present invention describes the case of capacitors in detail. It is apparent that the present invention is applicable to a wide range of surface mount electronic components without being limited to capacitors. Accordingly, the number of electrodes and lead terminals is not limited to the number as described in the preferred embodiment.

What is claimed is:

1. A surface mount electronic component comprising:

a substrate having two main faces;

an electrode made of a material in which migration, is substantially prevented, said electrode formed on both main faces of said substrate;

a lead terminal bonded to said electrode using a bonding material; and an external packaging material covering: i) said substrate, ii) said electrode; and iii) at least a part of said lead terminals.

2. A surface mount electronic component comprising:

a substrate having a main face;

a pair of electrodes disposed on said substrate;

a pair of lead terminals bonded respectively to said electrodes using a bonding material; and an external packaging material covering: i) said substrate, ii) said electrodes; and iii) at least a part of said lead terminals;

wherein a portion of said lead terminals exposed from said external packaging material is used as a terminal for connecting to an external part; said electrodes are formed on substantially the entire main face of said substrate; and said electrodes are made of a material in which migration is substantially prevented.

3. The surface mount electronic component as defined in claim 2, wherein said electrodes are formed by overlaying:

a first electrode made of a material in which migration is substantially prevented, said first electrode formed on said substrate; and a second electrode made of a material adherable to a bonding material, and formed on said first electrode.

4. The surface mount electronic component as defined in claim 2, wherein said bonding material melts at not lower than 190° C.

5. The surface mount electronic component as defined in claim 3, wherein said first electrode is made of a material containing at least one of nickel, zinc, palladium, gold, aluminum, and copper nickel alloy in a first group; and said second electrode is made of a material containing at least one of gold, silver, copper, platinum and nickel in a second group.

6. The surface mount electronic component as defined in claim 5, wherein said first electrode is made of one of zinc and zinc alloy; and said second electrode is made of one of copper and copper alloy.

7. The surface mount electronic component as defined in claim 2, wherein not less than 95% of said main face of said substrate is covered with said electrode.

8. The surface mount electronic component as defined in claim 2, said substrate further having a side face made rougher than said main face of said substrate.

9. The surface mount electronic component as defined in claim 2, wherein said substrate has a disc shape having a diameter between 2 mm and 8 mm, and a thickness between 0.3 mm and 1.2 mm.

10. The surface mount electronic component as defined in claim 3, wherein a thickness of said first electrode is between 1 $\mu$m and 10 $\mu$m.

11. The surface mount electronic component as defined in claim 3, wherein a thickness of said second electrode is between 1 $\mu$m and 20 $\mu$m.

12. The surface mount electronic component as defined in claim 2, wherein edges of said electrodes are located inside said substrate without protruding from the side face of said substrate.

13. The surface mount electronic component as defined in claim 12, wherein a sectional shape of said edges of said electrodes is curved.

14. The surface mount electronic component as defined in claim 2, wherein said lead terminal comprises:

a bonding area which is bonded to said electrode;

a stepped area stretching from said bonding area and rising from said electrode;

a horizontal area stretching from said stepped area substantially parallel to said electrode;

a vertical area stretching from said horizontal area substantially perpendicular to said electrode; and an external terminal area stretching from said vertical area.

15. The surface mount electronic component as defined in claim 3, wherein said first electrode is formed by applying and firing paste; and said second electrode is formed by plating.

* * * * *